United States Patent
Mizutani et al.

(10) Patent No.: US 8,940,644 B2
(45) Date of Patent: Jan. 27, 2015

(54) METHOD OF PRODUCING A SEMICONDUCTOR SUBSTRATE PRODUCT AND ETCHING LIQUID

(71) Applicant: FUJIFILM Corporation, Minato-ku, Tokyo (JP)

(72) Inventors: Atsushi Mizutani, Haibara-gun (JP); Tetsuya Kamimura, Haibara-gun (JP); Akiko Yoshii, Haibara-gun (JP); Tetsuya Shimizu, Shibuya-ku (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/770,282

(22) Filed: Feb. 19, 2013

(65) Prior Publication Data

US 2013/0244443 A1 Sep. 19, 2013

(30) Foreign Application Priority Data

Mar. 16, 2012 (JP) ................................. 2012-061163

(51) Int. Cl.
*H01L 21/302* (2006.01)
(52) U.S. Cl.
USPC ............. 438/753; 438/747; 216/99; 252/79.2
(58) Field of Classification Search
USPC .......... 438/745.751, 753, 756, 560, 561, 745, 438/747, 751; 216/83, 95, 99, 103, 104; 252/79.1, 79.2, 79.3
See application file for complete search history.

(56) References Cited

U.S. PATENT DOCUMENTS

| | | | |
|---|---|---|---|
| 6,991,991 B2 * | 1/2006 | Cheng et al. | 438/303 |
| 7,169,676 B1 * | 1/2007 | Zhong | 438/302 |
| 7,192,835 B2 * | 3/2007 | Tomimori et al. | 438/287 |
| 2006/0054597 A1 * | 3/2006 | Perng et al. | 216/83 |
| 2007/0145009 A1 * | 6/2007 | Fucsko et al. | 216/83 |
| 2009/0011523 A1 * | 1/2009 | Gale | 438/5 |
| 2010/0065945 A1 * | 3/2010 | Mita | 257/544 |
| 2012/0064722 A1 * | 3/2012 | Sakurai | 438/700 |
| 2012/0132263 A1 * | 5/2012 | Herbots et al. | 136/252 |

FOREIGN PATENT DOCUMENTS

| | | |
|---|---|---|
| JP | 10-050647 A | 2/1998 |
| JP | 2002-324901 A | 11/2002 |
| JP | 2003-171692 A | 6/2003 |
| JP | 2006-093242 A | 4/2006 |
| JP | 2008-047898 A | 2/2008 |
| WO | 2012/023387 A1 | 2/2012 |

OTHER PUBLICATIONS

Antoine Pacco, et al., "Galvanic Corrosion of PN Junctions during the Dielectric Removal with HF for RMG Transistors", ECS Trans. (2011), pp. 37-43, vol. 41, Issue 5.

(Continued)

*Primary Examiner* — Lan Vinh
(74) *Attorney, Agent, or Firm* — Sughrue Mion, PLLC

(57) ABSTRACT

A method for manufacturing a semiconductor substrate product having: providing an etching liquid containing water, a hydrofluoric acid compound and an organic solvent, and applying the etching liquid to a semiconductor substrate, the semiconductor substrate having a silicon layer and a silicon oxide layer, the silicon layer containing an impurity, and thereby selectively etching the silicon oxide layer.

24 Claims, 1 Drawing Sheet

(56) References Cited

OTHER PUBLICATIONS

Daisuke Watanabe, et al., "Galvanic Corrosion Suppression of High-k/Metal Gates Using Organic Solvent-Based Hydrogen Fluoride", Japanese Journal of Applied Physics, 2008, pp. 2425-2427, vol. 47, No. 4.

Japanese Office Action issued on Jan. 28, 2014 for corresponding Japanese Patent Application No. 2012-061163.

* cited by examiner

METHOD OF PRODUCING A SEMICONDUCTOR SUBSTRATE PRODUCT AND ETCHING LIQUID

FIELD OF THE INVENTION

The present invention relates to a method of producing a semiconductor substrate product and an etching liquid.

BACKGROUND OF THE INVENTION

An insulated gate field effect transistor has been developed, with installing a high-dielectric constant (high-k) film for a gate insulator film and a metal for a gate electrode. This type of transistor can reduce its gate-leak current and to keep the power consumption at a low level. The insulated gate field effect transistor according to the following method. That is, a dummy non-dielectric film is formed from a silicon oxide film on a silicon substrate and a dummy gate is formed thereon, and thereafter n-type impurities (or p-type impurities) are introduced into silicon substrates on both sides of the dummy gate to form a source/a drain. Further, after forming a sidewall of a silicon nitride film at both sides of the dummy gate, and via the step of removing the dummy gate and the dummy film in this order, and then both a high-dielectric constant gate insulator film and a metal gate electrode are formed.

In the above production process, there is, as an example, a method of using a diluted hydrofluoric acid in order to selectively remove the dummy film of the silicon oxide film after removing the dummy gate. However, in the wet etching of the dummy film using a diluted hydrofluoric acid, although selective etching is possible for the sidewall, a selective etching capacity for the source/drain is poor. As a result, a part of the source/drain exposed on the tip of the dummy gate under the sidewall is etched whereby a void (depression) is generated (for reference, e.g. Antoine Pacco et al., ECS Trans., Vol. 41, Issue 5, pp. 37-43) (for reference, void v in FIG. 2 attached). This is because a difference occurs between electrode potentials that materials have at the time of the wet etching on the ground that the impurity concentration of the source/drain is higher than the impurity concentration of a silicon substrate that becomes a channel-forming region between the source and the drain. Further, this is also because the source/drain and the channel-forming region become easy to undergo galvanic corrosion in combination with doping of impurities that are different in conductivity type from one another, and the end of the source/drain is dissolved with an etching liquid.

Also in a case of forming extension layers at gate ends of the source and the drain, the phenomenon similarly arises that the gate end sides of the extension layers are etched. This is because although the impurity concentration of the extension layer is lower than that of the source or the drain, there is a difference in the impurity concentration between the extension layer and the channel-forming region, and the conductivity type of the impurity is opposite to one another. When a void generates at the gate end side of the extension layer, a gate insulator film to be formed at the end of the extension layer is formed in the void in the case of forming a transistor. As a result, electric field gets centered on the portion, which gets to insulation breakdown. Thus, sometimes the transistor does not run.

SUMMARY OF THE INVENTION

The present invention resides in a method for manufacturing a semiconductor substrate product comprising:

providing an etching liquid containing water, a hydrofluoric acid compound and an organic solvent, and applying the etching liquid to a semiconductor substrate, the semiconductor substrate having a silicon layer and a silicon oxide layer, the silicon layer containing an impurity, and thereby selectively etching the silicon oxide layer.

Further, the present invention resides in an etching liquid comprising water, a hydrofluoric acid compound and a water-soluble polymer, the etching liquid for being applied to a semiconductor substrate, the semiconductor substrate having a silicon layer and a silicon oxide layer, the silicon layer containing an impurity, and thereby the silicon oxide layer being etched selectively.

Furthermore, the present invention resides in a method for manufacturing a semiconductor substrate product comprising the steps of:

preparing a silicon substrate having a p-type or an n-type impurity layer and a silicon oxide layer, the impurity being doped to a silicon layer, the both layers being exposed on the surface of the substrate;

preparing an etching liquid comprising water, a hydrofluoric acid compound and a water-soluble polymer; and applying the etching liquid to the silicon substrate and thereby selectively etching the silicon oxide layer.

In the present specification, the term "having" is to be construed in the open-ended meaning as well as the term "comprising" or "containing."

Other and further features and advantages of the invention will appear more fully from the following description, appropriately referring to the accompanying drawings.

REFERENCE SIGNS LIST

Figure 1:
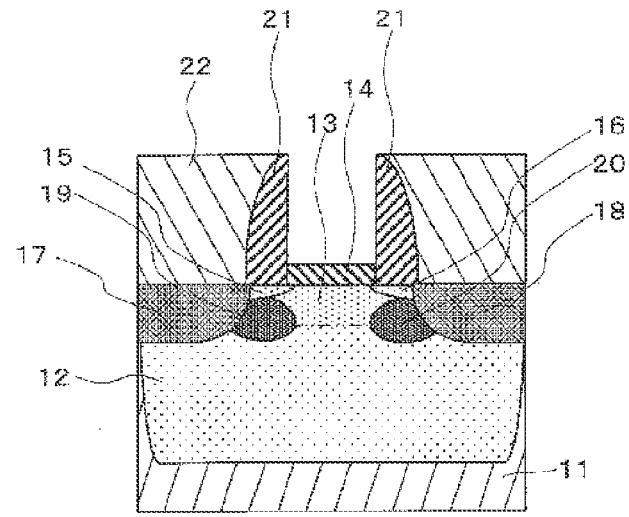
FIG. 1 is a main part-enlarged sectional view schematically showing one of preferable embodiments of the production method according to the present invention.

11 Silicon substrate
12 Well
13 Channel dope layer
14 Dummy film
15 and 16 Extension layers
17 and 18 Halo layers
19 Source
20 Drain
21 Sidewall
22 Interlayer insulation layer
v Void (depression)

DETAILED DESCRIPTION OF THE INVENTION

According to the present invention, there is provided the following means:

[1] A method for manufacturing a semiconductor substrate product comprising:

providing an etching liquid containing water, a hydrofluoric acid compound and an organic solvent, and applying the etching liquid to a semiconductor substrate, the semiconductor substrate having a silicon layer and a silicon oxide layer, the silicon layer containing an impurity, and thereby selectively etching the silicon oxide layer.

[2] The method for manufacturing a semiconductor substrate product described in the above item [1], wherein the concentration of the hydrofluoric acid compound is 3% by mass or less.
[3] The method for manufacturing a semiconductor substrate product described in the above item [1] or [2], wherein the organic solvent comprises an alcohol compound and/or an ether compound.
[4] The method for manufacturing a semiconductor substrate product described in any one of the above items [1] to [3], wherein the content of the organic solvent in the etching liquid is in a range of from 25% by mass to 80% by mass.
[5] The method for manufacturing a semiconductor substrate product described in any one of the above items [1] to [4], wherein the organic solvent comprises an alkylene glycol alkylether.
[6] The method for manufacturing a semiconductor substrate product described in any one of the above items [1] to [5], wherein the etching is conducted under the condition that the liquid temperature of the etching liquid on the substrate is 30° C. or lower.
[7] The method for manufacturing a semiconductor substrate product described in any one of the above items [1] to [6], wherein the etching is conducted by a single wafer etching equipment.
[8] The method for manufacturing a semiconductor substrate product described in any one of the above items [1] to [7], wherein the etching liquid after the etching is circulated to use again in the etching.
[9] The method for manufacturing a semiconductor substrate product described in any one of the above items [1] to [8], wherein a surface of the substrate is rinsed with isopropanol after the etching.
[10] The method for manufacturing a semiconductor substrate product described in any one of the above items [1] to [9], wherein the silicon layer containing the impurity further comprises germanium.
[11] The method for manufacturing a semiconductor substrate product described in any one of the above items [1] to [10], wherein the organic solvent is composed of a compound having a relative dielectric constant of 5 to 40.
[12] The method for manufacturing a semiconductor substrate product described in any one of the above items [1] to [11], wherein the organic solvent is composed of a compound having a flash point of 20 to 500° C.
[13] An etching liquid comprising water, a hydrofluoric acid compound and an organic solvent,
the etching liquid for being applied to a semiconductor substrate, the semiconductor substrate having a silicon layer and a silicon oxide layer, the silicon layer containing an impurity, and thereby the silicon oxide layer being etched selectively.
[14] The etching liquid described in the above item [13], wherein the concentration of the hydrofluoric acid compound is 3% by mass or less.
[15] The etching liquid described in the above item [13] or [14], wherein the content of the organic solvent in the etching liquid is in a range of from 25% by mass to 80% by mass.
[16] The etching liquid described in any one of the above items [13] to [15], wherein the organic solvent is composed of a compound having a relative dielectric constant of 5 to 40.
[17] The etching liquid described in any one of the above items [13] to [16], wherein the organic solvent is composed of a compound having a flash point of 20 to 500° C.
[18] A method for manufacturing a semiconductor substrate product comprising the steps of:

preparing a silicon substrate having a p-type or an n-type impurity layer and a silicon oxide layer, the impurity being doped to a silicon layer, the both layers being exposed on the surface of the substrate;
preparing an etching liquid comprising water, a hydrofluoric acid compound and an organic solvent; and
applying the etching liquid to the silicon substrate and thereby selectively etching the silicon oxide layer.
[19] A method for manufacturing a semiconductor product comprising:
manufacturing a semiconductor substrate product through the processes defined by any one of the above items [1] to [12]; and further processing the semiconductor substrate product to obtain a semiconductor product.

Hereinafter, preferable embodiments of the production method and the etching liquid of the present invention are described in detail with reference to FIGS. 1 and 2. In the following detailed descriptions, one step of the production process in accordance with a so-called "gate-last process" of an nMOS insulated gate field effect transistor is described as one example. However, the present invention should not be construed by limiting thereto.

Embodiment

As shown in FIG. 1 (process (a)), a single crystal silicon substrate is used as substrate 11. On the substrate 11, well 12 is formed in the region where a transistor is formed, and further a channel dope layer 13 is formed. In a case of producing an nMOS transistor, the well 12 is prepared so as to get a p-type well. For example, in accordance with an ion implantation method, boron ($B^+$) is used as an ion species, and an implant energy from 100 keV to 2 MeV and a dose amount of $1 \times 10^{11}$ atom/$cm^2$ to $1 \times 10^{12}$ atom/$cm^2$ are employed. In a case of producing a pMOS transistor, the well 12 is prepared so as to get an n-type well. The well 12 may not be produced depending on a conductivity type of the substrate 11.

Further, in a case of producing the nMOS transistor, the channel dope layer 13 is prepared so as to get a p-type. For example, in accordance with the ion implantation method, boron ($B^+$) is used as an ion species, and an implant energy from 10 keV to 20 KeV and a dose amount of $1 \times 10^{12}$ atom/$cm^2$ to $2 \times 10^{13}$ atom/$cm^2$ are employed. In a case of producing the pMOS transistor, the channel dope layer 13 is prepared so as to get an n-type. Before or after forming the well 12, an element isolation (not shown in FIG. 1) that electrically sectionalizes a formation region of an element such as a transistor is usually formed by an insulating film element isolation (for example, STI; Shallow Trench Isolation), or a diffusion layer element isolation.

As the above-described substrate 11, besides the above-described single crystal silicon substrate, various kinds of substrates having silicon layer, such as SOI (Silicon On Insulator) substrate, SOS (Silicon On Sapphire) substrate, a compound semiconductor substrate having silicon layer may be used. A circuit, an element, and the like may be formed, in advance, on the substrate 11.

Next, in the following order, a dummy film and a dummy gate film (not shown in FIG. 1) are formed on the substrate 11. A silicon oxide film is used as the dummy film 14. The silicon oxide film is formed, for example, in accordance with a CVD method, a thermal oxidation method, a rapid thermal oxidation method, a radical oxidation method, or the like, and impurities such as germanium, carbon, or the like may be incorporated in the film.

Next, the dummy gate film and the dummy film are processed using a lithographic technique to form a dummy gate (not shown in FIG. 1). At this time, the simultaneously processed dummy film 14 is left at the foot of the dummy gate.

Hereinafter, an nMOS transistor is described. Next, using the dummy gate as a mask, extension layers 15 and 16 are formed above the substrate 11 at each side of the dummy gate so that these layers are incorporated under the end of gate electrode, in order to improve pressure resistance by reducing a hot carrier. In the extension layers 15 and 16, n-type impurities (for example, arsenic ($As^+$)) are doped by using, for example, an ion implantation technique. As an example, implantation is performed under the conditions of implantation energy: from 0.1 KeV to 5 KeV and dose amount from $5\times10^{14}$ atom/$cm^2$ to $2\times10^{15}$ atom/$cm^2$. In addition, in the extension layers 15 and 16, carbon may be doped at the formation region of the extension layers 15 and 16, in order to improve mobility of transistor. This is because tensile stress is generated by doping carbon into the extension layers 15 and 16, and the channel dope layer 13 receives the resultant tensile stress whereby mobility of an nMOS (nMIS) transistor is improved. In addition, in a case of a pMOS transistor, germanium that generates compressive stress is doped into the extension layers 15 and 16, in order to improve mobility of transistor.

Further, using the ion implantation technique, halo layers 19 and 20 are formed at the positions that becomes respectively the end of source 17 and the end of drain 18 under the extension layers 15 and 16. For example, the halo layers are formed by using $BF_2^+$ as an ion species of a p-type impurity under the conditions of implantation energy: from 10 KeV to 15 KeV and dose amount from $1\times10^{13}$ atom/$cm^2$ to $1\times10^{14}$ atom/$cm^2$. The halo layers 19 and 20 are provided to reduce the impact of punch through generated in association with a short channel effect, and to adapt transistor characteristics to a desired value. Further, these layers are formed by ion implantation of impurities each having a conductivity type opposite to that of the source 17 and the drain 18, and are usually formed so that impurity concentration of the halo layers is higher than that of the channel dope layer 13. FIG. 1 (a) shows the state immediately after formation of the halo layers 19 and 20. Formation of the halo layers 19 and 20 prior to removal of the dummy film 14 has the advantage that the dummy film 14 acts as a buffer film whereby damage to the channel dope layer 13 due to ion implantation is suppressed.

Next, after formation of a side wall-forming insulation film on the entire surface of the substrate 11 of the side where the dummy gate has been formed, the side wall-forming insulation film is etched using an etchback technique in a manner such that the side wall-forming insulation film is left at a sidewall of the dummy gate. Thus, sidewalls 21 are formed at the sidewalls of the dummy gate. The side wall-forming insulation film is formed of a silicon nitride film, favorably in accordance with a usual chemical vapor deposition.

Next, using the dummy gate and the sidewalls 21 as a mask, the source 17 and the drain 18 are formed on the substrate 11. Ordinarily, the source 17 and the drain 18 are formed using, for example, an ion implantation technique in a manner such that n type impurities (for example, phosphorus ($P^+$) or arsenic ($As^+$) are doped up to the position deeper than the extension layers 15 and 16. For example, the source 17 and the drain 18 are formed using arsenic ($As^+$) as n-type impurities under the conditions of implantation energy: from 10 KeV to 50 KeV and dose amount from $1\times10^{13}$ atom/$cm^2$ to $5\times10^{15}$ atom/$cm^2$.

Next, in accordance with a conventional film formation technique, an interlayer insulation layer 22 is formed on the entire surface of the substrate 11 of the side where a dummy gate has been formed. Further, the surface of the interlayer insulation layer 22 is subjected to a planarization step. The interlayer insulation layer 22 is formed of a silicon oxide film, a silicon nitride film, or a silicon oxynitride film. Thereafter, an upper portion of the dummy gate is exposed from the interlayer insulation layer 22 in accordance with a chemical mechanical polishing (CMP: Chemical Mechanical Polishing), or the etchback technique. Further, the dummy gate is selectively removed by etching using the interlayer insulation layer 22 as an etching mask. The etching of the dummy gate may be a wet etching or a dry etching.

Next, the above-described dummy film 14 is selectively removed in accordance with the wet etching. In the wet etching, an etching liquid containing water, a hydrofluoric acid compound and an organic solvent is used. The etching liquid is described below. The state immediately after removal of the dummy film 14 is shown in FIG. 2 (process b). As a result, the state in which the channel dope layer 13 is exposed between both sidewalls 21 is obtained. Using the etching liquid, only the dummy film 14 of silicon oxide is removed by etching without etching the extension layers 15 and 16 that are the underlying silicon layer. By this, generation of void is prevented in the extension layers 15 and 16 at the gate end. Accordingly, even though a gate insulator film is formed at this portion, electric field concentration is difficult to be caused whereby reliability of the transistor is improved. In FIG. 2, for the sake of convenience to understand, the tip of the extension layer 16 is shown by enlarging it in a circle. The state in which a void (depression) v generates there is illustrated. According to the present invention, the void v can be favorably suppressed or prevented.

Figure 2:
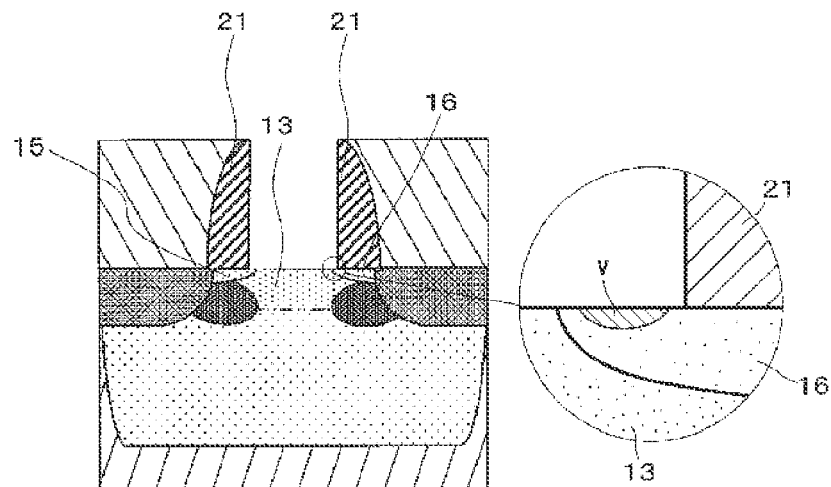
FIG. 2 is a main part-enlarged sectional view schematically showing one of preferable embodiments (continued) of the production method according to the present invention.

Next, though not shown in FIG. 2, a gate insulator film is formed on a surface of the exposed channel dope layer 13 and on sidewalls of the sidewalls 21, and the gate electrode film is formed so as to implant it between both sidewalls 21. After that, redundant gate electrode film and gate insulator film on the interlayer insulation layer 22 are removed. For the removal, a CMP technique is ordinarily used. As a result, a gate electrode that is composed of a gate electrode film is formed on the channel dope layer 13 between both side walls 21 through the gate insulator film.

As the above gate film, High-k film can be used. Examples of High-k film include hafnium oxide ($HfO_2$), hafnium alminium oxide ($HfAlO_2$), hafnium silicate (HfSiO), tantalum oxide ($Ta_2O_5$), alminium oxide ($Al_2O_3$), and zirconium oxide ($ZrO_2$). Usual methods such as ALD: Atomic Layer Deposition and CVD: Chemical Vapor Deposition are used for film formation of the film. The film thickness of the gate film is preferably 1 nm to 3 nm. Further, the gate insulator film may be a laminated film of a silicon oxide film and a silicon oxynitride film.

Examples of the above gate electrode include titanium nitride (TiN), titanium (Ti), titanium silicon (TiSi), nickel (Ni), nickel silicide (NiSi), hafnium (Hf), hafnium silicide (HfSi), tungsten (W), tantalum (Ta), tantalum silicide (TaSi), tantalum nitride silicide (TaSiN), cobalt (Co), cobalt silicide (CoSi), ruthenium (Ru), and indium (Ir). The film is usually formed by ALD method or PVD: Physical Vapor Deposition) method.

After that, an interlayer insulation film is formed, and then a wire formation step and other element formation steps are performed.

The dose amount and the implantation energy described in the above-described ion implantation steps, are examples, and these amount and energy are appropriately determined according to the kind of a transistor and characteristics thereof

[Etching Liquid]

Next, descriptions are given about a preferable embodiment of the etching liquid of the present invention that can be used very effectively in the wet etching described in the process of removing the above-described dummy film 14. The etching liquid of the present embodiment contains water, a hydrofluoric acid, and an organic solvent. This enables removal of a silicon oxide film as mentioned above without etching the underlying silicon layer having impurities doped.

(Water)

In the etching liquid of the present invention, water is suitably used as its medium, and it is preferred that the etching liquid is an aqueous solution in which each component is uniformly dissolved. Water is a residue of the total mass of the etching liquid from which a hydrofluoric acid compound and an organic solvent are excluded. Accordingly, the total means 100% by mass. Water may be an aqueous medium containing dissolved components, as long as they do not undermine the effectiveness of the present invention, or may contain inevitable trace mixed components. Especially, a clarified water such as distilled water, ion exchanged water, or ultrapure water is preferred, and ultrapure water that is used for semiconductor device production is particularly preferred.

(Hydrofluoric Acid Compound)

A hydrofluoric acid compound is defined as a compound which means a compound generating a fluorine ion (F−) in a system, examples of which include fluoric acid (hydrofluoric acid) and salts thereof. Specifically, examples of the fluoric acid compound include fluoric acid, alkali metal fluoride (NaF, KF, and the like), amine hydrofluoride (monoethylamine hydrofluoride, triethylamine trihydrofluoride, and the like), pyridine hydrofluoride, ammonium fluoride, quaternary alkyl ammonium fluoride (tetramethyl ammonium fluoride, tetra n-butyl ammonium fluoride, and the like), $H_2SiF_6$, $HBF_4$ and $HPF_6$. Among them, fluoric acid, amine hydrofluoride (monoethylamine hydrofluoride, triethylamine trihydrofluoride, and the like), pyridine hydrofluoride, ammonium fluoride, quaternary alkyl ammonium fluoride (tetramethyl ammonium fluoride, tetra n-butyl ammonium fluoride, and the like), $H_2SiF_6$, $HBF_4$ and $HPF_6$ are preferably, fluoric acid, ammonium fluoride, quaternary alkyl ammonium fluoride (tetramethyl ammonium fluoride), $H_2SiF_6$, $HBF_4$ and $HPF_6$ are more preferably, fluoric acid is particularly preferred.

The hydrofluoric acid compound is preferably contained in a range from 0.01 to 10% by mass, and more preferably from 0.1 to 3% by mass, with respect to the total mass of the etching liquid of the present embodiment. When the content is controlled to the above-described upper limit or less, etching of the silicon layer can be preferably suppressed. When the content is controlled to the above-described lower limit or more, a silicon oxide layer can be preferably etched at a velocity sufficient to do it.

In the present specification, when the name of a chemical is called by putting the term "compound" at the foot of the chemical name, or when the chemical is shown by a specific name or a chemical formula, a showing of the compound is used to mean not only the compound itself, but also a salt or ion thereof and the like. Further, the showing of the compound is also used to mean incorporation of derivatives modified by a predefined configuration to an extent necessary to obtain a desired effect. Further, in the present specification, a substituent (including a linking group) in which substitution or non-substitution is not explicitly stated means that the substituent may have any substituent.

(Organic Solvent)

The organic solvent used for constitution of the etching liquid of the present embodiment is not particularly limited; however, preferably the organic solvent has a low dielectric constant and uniformly disperses or dissolves in an aqueous medium, and more preferably the organic solvent uniformly dissolves in a predetermined content. The lower the dielectric constant, the more preferable the organic solvent is. Examples of these water-soluble organic solvent include alcohol compounds and ether compounds.

(Water-Soluble Organic Solvent)

The water-soluble organic solvent is desirable in terms of corrosion prevention. Examples of the water-soluble organic solvent include: alcohol compound solvents, such as methyl alcohol, ethyl alcohol, 1-propyl alcohol, 2-propyl alcohol, 2-butanol, ethylene glycol, propylene glycol, glycerol, 1,6-hexanediol, cyclohexanediol, sorbitol, xylitol, 2-methyl-2,4-pentanediol, 1,3-butanediol, and 1,4-butanediol; ether compound solvents, such as an alkylene glycol alkyl ether including ethylene glycol monomethyl ether, diethylene glycol, dipropylene glycol, propylene glycol monomethyl ether, diethylene glycol monomethyl ether, triethylene glycol, poly(ethylene glycol), propylene glycol monomethyl ether, dipropylene glycol monomethyl ether, tripropylene glycol monomethyl ether, diethylene glycol monobutyl ether, and diethylene glycol monobutyl ether; amide compound solvents, such as formamide, monomethylformamide, dimethylformamide, acetamide, monomethylacetamide, dimethylacetamide, monoethylacetamide, diethylacetamide, and N-methylpyrrolidone; sulfur-containing compound solvents, such as dimethyl sulfone, dimethyl sulfoxide, and sulfolane; and lactone compound solvents, such as γ-butyrolactone and δ-valerolactone.

Among them, an alcohol compound having 1 to 4 carbon atom(s) and an ether compound having 3 to 10 carbon atoms are preferable. An alcohol/ether compound having a hydroxyl group and an ether group is more preferable. Among them, an alkylene glycol alkyl ether (having 3 to 10 carbon atoms) is preferable, an ethylene glycol alkyl ether is more preferable, an ethylene glycol monobutyl ether is particularly preferable. The water-soluble organic solvents may be used singly or in an appropriate combination of two or more types. In the present specification, the compound having both a hydroxyl group (—OH) and an ether group (—O—) in the molecule thereof is basically in the category of ether compounds (this is not referred to as an alcohol compound). When being distinguished from both of a hydroxyl group and an ether group, this compound may be referred to as an alcohol/ether compound.

Further, as the other definition, it is preferable to use a water-soluble organic solvent represented by the following formula (O-1).

$$R^{11}\text{—}(\text{—O—}R^{13}\text{—})_n\text{—O—}R^{12} \qquad (\text{O-1})$$

$R^{11}$ and $R^{12}$ $R^{11}$ and $R^{12}$ each independently represent a hydrogen atom or an alkyl group having 1 to 5 carbon atom(s). Among them, an alkyl group having 1 to 5 carbon atom(s) is preferable, and an alkyl group having 1 to 3 carbon atom(s) is more preferable.

$R^{13}$ $R^{13}$ represents a linear or branched alkylene group having 1 to 4 carbon atom(s). When the compound has a plurality of $R^{13}$, they can be respectively differed.

n n represents an integer of 0 to 6. When n is 0, $R^{11}$ and $R^{12}$ are not hydrogen atoms simultaneously.

As for the content of the organic solvent in the etching liquid, for example, in the case where the organic solvent is an alkylene glycol alkylether, it is preferably contained in a range of from 10 to 90% by mass, more preferably from 20 to 85% by mass, and still more preferably from 25 to 80% by mass, with respect to the total mass of the etching liquid of the present embodiment. Selectivity in the etching can be enhanced by incorporation of the organic solvent. Although it is not clear why selectivity is enhanced, it is thought that, by lowering relative permittivity (relative dielectric constant) of the etching liquid, electric conductivity in the liquid is reduced, which contributes to enhancement of selectivity. Due to this contribution, it is presumed that even though the etching liquid is in contact with a p-type impurity layer and an n-type impurity layer, a potential of which is different from one another, an electric current becomes to hardly flow through the etching liquid, and as a result generation of galvanic corrosion is prevented whereby etching resistance of the silicon layer containing conductivity impurities can be enhanced.

A combination of a content ratio of a hydrofluoric acid compound and a content ratio of the above-described organic solvent in the etching liquid is preferably as follows. The mass amount of the hydrofluoric acid compound is representatively indicated by the mass amount of hydrofluoric acid.

|  | HF | Organic solvent |
|---|---|---|
| Preferably | from 0.01 to 10% by mass | from 10 to 90% by mass |
| More preferably | from 0.1 to 5% by mass | from 20 to 85% by mass |
| Particularly preferably | from 0.1 to 3% by mass | from 25 to 80% by mass |

In the present invention, the higher the flash point of an etching liquid to be applied there, the more the etching liquid is preferred. In consideration that a representative processing temperature is in a range of from 20 to 25° C., the flash point is preferably 20° C. or higher, more preferably 25° C. or higher, and particularly preferably 35° C. or higher. Although there is no particular upper limit, in view of properties of this kind of organic solvents, 500° C. or lower is a practical limitation.

From the above-described reason, it is preferable to use an organic solvent with a particular range of relative permittivity in the etching liquid of the present invention. Specifically, the relative permittivity is preferably from 5 to 40, more preferably from 5 to 30, and particularly preferably from 5 to 18.

Yozai Hand book (Solvent Hand book), Forth Ed., published by Kodansha Scientific Ltd. may be referred for the values of the above-described flash point and relative permittivity.

The organic solvent may further contain a pH adjuster. Among examples of the pH adjuster, preferable examples of alkali/acid include: non-metal alkali agents such as organic ammonium hydroxides such as ammonia, ammonium hydroxide or tetramethyl ammonium hydroxide and alkanol amines such as diethanol amine, triethanol amine or triisopropanol amine; alkali metal hydroxides such as sodium hydroxide, potassium hydroxide, or lithium hydroxide; inorganic acids such as nitric acid, sulfuric acid, or phosphoric acid; carbonate such as sodium carbonate; phosphate such as tri-sodium phosphate; borate; tetraborate; and hydroxybenzoate. Particularly preferable alkali agents are ammonium hydroxide, potassium hydroxide, lithium hydroxide and tetramethyl ammonium hydroxide.

(Workpiece Material)

Any of a structure, a shape, a size and the like of a semiconductor substrate product to be processed is not particularly limited. However, in the production process of insulated gate field effect transistor which forms an extension layer and source/drain using a dummy gate, a dummy film and a sidewall, as described above, it is preferable to determine the structure, the shape, the size and the like so that high effect is obtained in etching of the dummy film after removal of the dummy gate in particular.

The production method of a semiconductor substrate product and the etching liquid of the present invention is not only applied to the above-described production process, but also can be used for various kinds of etching without any particular limitation.

(Etching Method)

The etching equipment used in the present invention is not particularly limited, but a single-wafer-type etching equipment can be used. Single-wafer-type etching is a method of etching the wafers one by one. One embodiment of the single wafer etching is a method of causing the etching liquid spread to the whole surface of the wafer by a spin coater.

Liquid temperature of the etching liquid, discharge rate of the etching liquid and rotation speed of the wafer of the spin coater are used to select the appropriate value by the choice of substrate to be etched.

In the present embodiment, although the etching condition is not particularly limited, the single-wafer-type etching is preferred. In the single-wafer-type etching, semiconductor substrates are transported or rotated in the predetermined direction, and an etching liquid is discharged in a space between them to put the etching liquid on the semiconductor substrate. According to the necessity, etching liquid may be sprayed while rotating the semiconductor substrate using a spin coater.

An environmental temperature of etching is described below. In the case of the single-wafer-type, the temperature of the spraying interspace for etching is set to a range of preferably from 20 to 40° C., and more preferably from 20 to 30° C. On the other hand, the temperature of the etching liquid is preferably set at 30° C. or lower, and more preferably from 20 to 30° C. It is preferable to set the temperature to the above-described lower limit or more because an adequate etching rate with respect to a silicon oxide layer can be ensured by the temperature. It is preferable to set the temperature to the above-described upper limit or less because selectivity of etching can be ensured by the temperature. The supply rate of the etching liquid is not particularly limited, but is set to a range of preferably from 0.3 to 3 L/min, and more preferably from 0.5 to 2 L/min. It is preferable to set the supply rate to the above-described lower limit or more because uniformity of etching in a plane can be ensured by the supply rate. It is preferable to set the supply rate to the above-described upper limit or less because stable selectivity at the time of continuous processing can be ensured by the supply rate. When the semiconductor substrate is rotated, it is preferable from the same view point as the above to rotate the semiconductor substrate at a rate from 100 to 1,000 rpm, even though the rate may depend on the size or the like of the semiconductor substrate.

(Chemical Liquid Supply System and Temperature Regulation)

In the present invention, although the temperature-regulated chemical liquid supply line system is not particularly limited, preferable examples thereof are described below. The term "temperature regulation" herein used refers to maintaining the chemical liquid at a predetermined temperature. Ordinarily, the chemical liquid is maintained by heating at a predetermined temperature.

Examples of Chemical Supply Line
(1) (a) Chemical storage tank→(b) Temperature-regulating tank→(c) Inline temperature regulation→(d) Ejection to wafer→Return to (a) or (b).
(2) (a) Chemical liquid tank→(b) Temperature-regulating tank→(d) Ejection to wafer→Return to (a) or (b).
(3) (a) Chemical liquid tank→(c) Inline temperature regulation→(d) Ejection to wafer→Return to (a)
(4) (a) Chemical liquid tank→(b) Temperature-regulating tank→(e) Etching bath (Circulation temperature regulation).
(5) (a) Chemical liquid tank→(e) Etching bath (Circulation temperature regulation).
(6) (b) Temperature-regulating tank→(d) Ejection to wafer→Return to (b).
(7) (b) Temperature-regulating tank→(c) Inline temperature regulation→(d) Ejection to wafer Return to (b).
(8) (b) Temperature-regulating tank→(e) Etching bath (Circulation temperature regulation). The above methods are used.

The chemical liquid already used in the method of the present invention can be re-used by circulation. Preferable method is not "free-flowing" (without re-use), but re-use by circulation. It is possible to continue circulation for 1 hour or longer after heating, which makes it possible to perform a repetitive etching. Although there is no particular upper time limit of the circulating-reheating, exchange within a week is preferable because etching rate deteriorates with age. The exchange within 3 days is more preferable. An exchange to a flesh liquid once a day is particularly preferable. In the etching of the above-described line system, the measurement position of the temperature-regulated temperature may be determined appropriately by the relation to a line configuration or a wafer. Typically, the measurement position is regulated by adjusting the tank temperature. In the case where relatively more strict conditions in terms of performance are required, wherever the measurement and the regulation are feasible, the temperature-regulated temperature may be defined by a wafer surface temperature. In this case, temperature measurement is conducted using a radiation thermometer.

The underlayer in the present invention is a silicon layer having a p-type impurity layer and an n-type impurity layer, or a silicon layer having a p-type impurity layer and an n-type impurity layer and further incorporating therein germanium or carbon. The silicon layer herein used refers to one single crystal grain of a single crystal silicon layer or a polycrystal silicon layer. The single crystal silicon layer refers to a silicon crystal in which orientation of the atomic arrangement is aligned throughout the crystal. In fact, however, when observed at the atomic level, the presence of various defects is found. Further, the p-type impurity layer refers to a layer in which p-type impurities (for example, $B^+$, $BF^{2+}$ and the like) are doped in the above-described underlayer. On the other hand, the n-type impurity layer refers to a layer in which n-type impurities (for example, $P^+$, $As^+$, $Sb^+$ and the like) are doped in the above-described underlayer.

A layer to be etched in the present invention refers to a layer of which constituent elements are silicon and oxygen. Specifically, the layer to be etched is composed of silicon dioxide ($SiO_2$), a silicon dioxide derivative of which Si has a dangling bond, a silicon dioxide derivative in which a dangling bond of Si combines with hydrogen, or the like. Further, germanium or carbon may be incorporated therein.

An etching target in the present invention is silicon oxide, or silicon oxide further incorporating therein germanium or carbon, an underlayer of the silicon oxide being a silicon layer having a p-type impurity layer and an n-type impurity layer, or a silicon layer having a p-type impurity layer and an n-type impurity layer and further incorporating therein germanium or carbon. Herein, its meaning is described.

The etching liquid of the present invention for silicon oxide is able to remove a layer to be etched composed of silicon oxide or silicon oxide further incorporating therein germanium or carbon, by etching without causing galvanic corrosion, even in the case where the silicon layer having impurity layers different from one another in conductivity is an underlayer.

In the present specification, the term "semiconductor substrate" is not only used to mean a silicon substrate (wafer), but also used in a broader meaning that includes a whole substrate structure on which a circuit structure is provided. The semiconductor substrate member refers to a member that constitutes the above-defined semiconductor substrate, and may be composed of a single material or a plurality of materials. The processed semiconductor substrate may be called a semiconductor substrate product in order to distinguish it from a pre-processed semiconductor substrate. For further discrimination, if needed, a chip picked up by singulation after a processing of the semiconductor substrate product, and a chip processed product are called a semiconductor element or semiconductor device. That is, in a broad sense, the semiconductor element (semiconductor device) belongs to the semiconductor substrate product. The direction of the semiconductor substrate is not particularly limited. However, for convenience of description, in the present specification, the side of sidewall 21 is specified as upside (upper side), while the side of substrate 11 is specified as lower side (bottom side). The structure of the semiconductor substrate or its members is illustrated in the attached figures by simplifying them. Accordingly, they should be interpreted as an appropriate form, as needed.

The present invention is contemplated for providing a method of producing a semiconductor substrate product and an etching liquid that are capable of protecting a silicon layer doped with conductivity-type impurities and selectively etching a silicon oxide layer.

According to the production method of the present invention, selective etching of a silicon oxide layer can be achieved with protecting a silicon layer doped with impurities and keeping a sufficient etching rate. As a result, this method is able to produce a higher-quality semiconductor substrate product such as a High-K/Metal Gate transistor, of which miniaturization has been further advanced recently, and a higher-quality semiconductor device using the same.

Further, the etching liquid of the present invention is useful for application to production of the semiconductor substrate product or a semiconductor device that achieves the above-described excellent quality.

The present invention will be described in more detail based on examples given below, but the invention is not meant to be limited by these.

EXAMPLES

Example 1 and Comparative Example 1

Etching liquids having the components and the composition (% by mass) of each of the test Nos. shown in Table 1 below were prepared.
<Etching Test>
The pattern shown in the above-mentioned FIG. 1 (process a) and produced by the production method described in the above embodiment was prepared Using a single crystal <100> silicon substrate as a substrate, ion implantation of boron into the substrate under the conditions of dose amount of $3 \times 10^{14}$ atom/cm$^2$ and implant energy of 210 KeV was conducted to form a channel dope layer. Further, in order to form extension layers, ion implantation of arsenic was conducted under the conditions of dose amount of $1.0 \times 10^{15}$ atom/cm$^2$ and implant energy of 3 KeV.

A silicon nitride film was used for a sidewall, and a SiO$_2$ film was used for a dummy film.

The substrate having the above-described dummy film and sidewall formed thereon was etched under the following conditions using a single wafer equipment (POLOS (trade name), manufactured by SPS-Europe B.V.).

(Etching Condition)
Temperature of chemical liquid: 25° C.
Discharge rate: 2 L/min.

Wafer rotation number: 500 rpm

After etching, rinse with water and then drying was conducted.

(T (Wafer) Measuring Method)

The above-described chemical liquid temperature was measured as follows. A radiation thermometer IT-550F manufactured by HORIBA Ltd. was fixed at the height of 30 cm from a wafer in the single wafer equipment. Temperature was measured while flowing the chemical liquid in a manner such that the thermometer was pointed to a wafer surface at the distance of 2 cm outside from the center of the wafer. The temperature was output digitally from the radiation thermometer and recorded using a personal computer. With respect to the timing of measurement, because an initial temperature of the etching treatment is heading for an upturn, and thereafter the temperature becomes lower, an average value of the temperature for the last-10 seconds of the treatment time as a sufficiently stable timing was defined as a temperature on the wafer.

<Evaluation Method>

Evaluation was conducted in terms of removal property of a SiO$_2$ film on the channel dope layer and existence or non-existence of the void of the extension layer. In either evaluation, cross-section observation of the extension layer was visually performed using TEM. The removal rate was evaluated using a ratio of areas of the extension layer before and after the treatment.

(Removal Property of SiO$_2$ Film)

Evaluation of the removal property of the SiO$_2$ film was conducted by way categorizing the removal rate as follows.
A: Removal rate was 100%.
B: Removal rate was from 80% to less than 100%
C: Removal rate was from 50% to less than 80%
D: Removal rate was less than 50%

(Existence or Non-Existence of Void)

Evaluation of void was performed by determining if a void generated in the extension layer, and the case where the void generated was expressed by "existence", while the case where no void generated was expressed by "None-existence".

TABLE 1

| | Composition | | | | Characteristic | | Evaluation result | |
|---|---|---|---|---|---|---|---|---|
| No. | HF concentration (mass %) | Kind of solvent | Concentration (mass %) | Water | Relative dielectric constant | Flash point (° C.) | Removal property of SiO$_2$ film | Existence or non-existence of void |
| 101 | 1 | IP | 35 | Balance | 18.3 | 12 | B | Non-existence |
| 102 | 2 | EGmME | 65 | Balance | 16.9 | 46 | A | Non-existence |
| 103 | 3 | EG | 50 | Balance | 38.7 | 111 | C | Non-existence |
| 104 | 0.5 | EGmBE | 50 | Balance | 9.3 | 74 | A | Non-existence |
| 105 | 1 | PGmME | 45 | Balance | 12.3 | 39 | A | Non-existence |
| 106 | 0.2 | PGmME | 90 | Balance | 12.3 | 39 | C | Non-existence |
| 107 | 2 | EGmEE | 70 | Balance | 29.6 | 59 | B | Non-existence |
| 108 | 1 | DPGmME | 20 | Balance | 10.5 | 85 | C | Non-existence |
| C11 | 1 | None | — | Balance | — | — | A | Existence |
| C12 | 0 | PGmME | 40 | Balance | — | — | D | Non-existence |

<Notes in Table>
IP: Isopropanol
EG: Ethylene glycol
EGmME: Ethylene glycol monomethyl ether
EGmEE: Ethylene glycol monoethyl ether
EGmBE: Ethylene glycol monobutyl ether
PGmME: Propylene glycol monomethyl ether
DPGmME: Dipropylene glycol monomethyl ether As seen from the above-described results, with respect to a silicon layer having impurity layers, conductivity types of which are different from one another, like a channel dope layer and an extension layer, the method of producing a semiconductor substrate product and the etching liquid of the present invention was able to selectively etch a SiO$_2$ layer without etching the silicon layer.

In view of the above, it is very effective to apply the method of the present invention to a production process of a MIS transistor including a step of removing a dummy gate and a dummy film to form a gate insulator film and a gate electrode, especially a step of removing the dummy film. As a result, it is seen that the method of the present invention exerts excellent effects on the reliability of a transistor.

Example 2

After the above-described etching test, while circulating the etching liquid (the above-described Chemical Nos. 104 and 105) used in the Example, the same etching as in the etching test of the above-described Example was conducted three times. As for the obtained etching performance, it was confirmed that all the SiO$_2$ film was able to be etched and also no void generated in the extension layer.

Example 3

Rinse after etching with an etching liquids (the above-described chemical liquid Nos. 104 and 105) was conducted using isopropanol in place of water. As a result, it was confirmed that the number of defect in-plane of the wafer was drastically reduced. Herein, the defect refers to generation of watermark.

Having described our invention as related to the present embodiments, it is our intention that the invention not be limited by any of the details of the description, unless otherwise specified, but rather be construed broadly within its spirit and scope as set out in the accompanying claims.

This non-provisional application claims priority under 35 U.S.C. §119 (a) on Patent Application No. 2012-061163 filed in Japan on Mar. 16, 2012, which is entirely herein incorporated by reference.

What is claimed is:

1. A method for manufacturing a semiconductor substrate product comprising:
    providing an etching liquid containing water, a hydrofluoric acid compound and an organic solvent, and
    applying the etching liquid to a semiconductor substrate, the semiconductor substrate having at least two silicon layers and a silicon oxide layer, the two silicon layers containing a p-type impurity and a n-type impurity, respectively, the silicon layers and the silicon oxide layer being exposed or to be exposed so as to contact with the etching liquid, and thereby selectively etching the silicon oxide layer,
    wherein the composition of the etching liquid is selected such that the etching resistance of the silicon layers is enhanced and galvanic corrosion is inhibited, and
    wherein the organic solvent is represented by the following formula (O-1):

$$R^{11}-(-O-R^{13}-)_n-O-R^{12} \quad (O-1)$$

wherein R$^{11}$ and R$^{12}$ each independently represents a hydrogen atom or an alkyl group having 1 to 5 carbon atom(s),
    R$^{13}$ represents a linear or branched alkylene group having 1 to 4 carbon atom(s), and
    n represents an integer of 0 or 1.

2. The method for manufacturing a semiconductor substrate product according to claim 1, wherein the concentration of the hydrofluoric acid compound is 3% by mass or less.

3. The method for manufacturing a semiconductor substrate product according to claim 1, wherein the organic solvent comprises an alcohol compound and/or an ether compound.

4. The method for manufacturing a semiconductor substrate product according to claim 1, wherein the content of the organic solvent in the etching liquid is in a range of from 25% by mass to 80% by mass.

5. The method for manufacturing a semiconductor substrate product according to claim 1, wherein the organic solvent comprises an alkylene glycol alkyl ether.

6. The method for manufacturing a semiconductor substrate product according to claim 1, wherein the etching is conducted under the condition that the liquid temperature of the etching liquid on the substrate is 30° C. or lower.

7. The method for manufacturing a semiconductor substrate product according to claim 1, wherein the etching is conducted by a single wafer etching equipment.

8. The method for manufacturing a semiconductor substrate product according to claim 1, wherein the etching liquid after the etching is circulated to use again in the etching.

9. The method for manufacturing a semiconductor substrate product according to claim 1, wherein a surface of the substrate is rinsed with isopropanol after the etching.

10. The method for manufacturing a semiconductor substrate product according to claim 1, wherein the silicon layer containing the impurity further comprises germanium.

11. The method for manufacturing a semiconductor substrate product according to claim 1, wherein the organic solvent is composed of a compound having a relative dielectric constant of 5 to 40.

12. The method for manufacturing a semiconductor substrate product according to claim 1, wherein the organic solvent is composed of a compound having a flash point of 20 to 500° C.

13. A method for manufacturing a semiconductor product comprising:
    manufacturing a semiconductor substrate product through the processes defined by claim 1; and further processing the semiconductor substrate product to obtain a semiconductor product.

14. The method for manufacturing a semiconductor substrate product according to claim 1, wherein the p-type impurity is selected from the group consisting of P$^+$, As$^+$, and Sb$^+$.

15. The method for manufacturing a semiconductor substrate product according to claim 1, wherein the n-type impurity is selected from the group consisting of B$^+$ and BF$_2^+$.

16. The method for manufacturing a semiconductor substrate product according to claim 1, wherein the organic solvent is an (mono) alkylene glycol alkyl ether having 3-10 carbon atoms.

17. The method for manufacturing a semiconductor substrate product according to claim 1, wherein the two silicon layers are located under the silicon oxide layer to be removed.

18. An etching liquid comprising water, a hydrofluoric acid compound and an organic solvent,
    the etching liquid for being applied to a semiconductor substrate, the semiconductor substrate having a silicon layer and a silicon oxide layer, the silicon layer containing an impurity, and thereby the silicon oxide layer being etched selectively,
    wherein the organic solvent is represented by the following formula (O-1):

$$R^{11}-(-O-R^{13}-)_n-O-R^{12} \quad (O-1)$$

wherein R$^{11}$ and R$^{12}$ each independently represent a hydrogen atom or an alkyl group having 1 to 5 carbon atom(s),
    R$^{13}$ represents a linear or branched alkylene group having 1 to 4 carbon atom(s), and
    n represents an integer of 0 or 1.

19. The etching liquid according to claim 18, wherein the concentration of the hydrofluoric acid compound is 3% by mass or less.

20. The etching liquid according to claim 18, wherein the content of the organic solvent in the etching liquid is in a range of from 25% by mass to 80% by mass.

21. The etching liquid according to claim 18, wherein the organic solvent is composed of a compound having a relative dielectric constant of 5 to 40.

22. The etching liquid according to claim 18, wherein the organic solvent is composed of a compound having a flash point of 20 to 500° C.

23. A method for manufacturing a semiconductor substrate product comprising the steps of:
preparing a silicon substrate having a p-type or an n-type impurity layer and a silicon oxide layer, the impurity being doped to a silicon layer, the both layers being exposed on the surface of the substrate;
preparing an etching liquid as claimed in claim 18; and
applying the etching liquid to the silicon substrate and thereby selectively etching the silicon oxide layer.

24. The etching liquid according to claim 18, wherein the organic solvent is EGmME, EGmEE, EGmBE, or PGmME.

* * * * *